United States Patent
Tagami (10) Patent No.: US 10,802,051 B2
(45) Date of Patent: Oct. 13, 2020

(54) WAVEFORM DISPLAY DEVICE THAT ALLOWS CYCLE TIME COMPARISON TO BE MADE

(71) Applicant: FANUC CORPORATION, Yamanashi (JP)

(72) Inventor: Kouta Tagami, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 230 days.

(21) Appl. No.: 15/410,754

(22) Filed: Jan. 19, 2017

(65) Prior Publication Data
US 2017/0212149 A1    Jul. 27, 2017

(30) Foreign Application Priority Data

Jan. 26, 2016    (JP) .................................. 2016-012473

(51) Int. Cl.
*G01R 13/02*    (2006.01)
*G05B 19/408*    (2006.01)

(52) U.S. Cl.
CPC ....... *G01R 13/029* (2013.01); *G01R 13/0218* (2013.01); *G01R 13/0236* (2013.01)

(58) Field of Classification Search
CPC .............. G01R 13/029; G01R 13/0236; G01R 13/0218
See application file for complete search history.

(56) References Cited

U.S. PATENT DOCUMENTS

| | | | | |
|---|---|---|---|---|
| 4,843,309 A | * | 6/1989 | Kareem | ............... G01R 13/225 324/121 R |
| 2002/0008702 A1 | * | 1/2002 | Gilbert | ................. G01R 13/345 345/440.1 |
| 2010/0265253 A1 | * | 10/2010 | Li | ......................... G06T 11/203 345/440 |

(Continued)

FOREIGN PATENT DOCUMENTS

| JP | 7-174789 A | 7/1995 |
|---|---|---|
| JP | 2007-248437 A | 9/2007 |

(Continued)

OTHER PUBLICATIONS

Wikipedia Oscilloscope Types: https://web.archive.org/web/20110603162058/https://en.wikipedia.org/wiki/Oscilloscope_types, retrieved by Archive.org on Jun. 3, 2011. (Year: 2011).*

(Continued)

*Primary Examiner* — Alexander Satanovsky
*Assistant Examiner* — Mark I Crohn
(74) *Attorney, Agent, or Firm* — Hauptman Ham, LLP (57) ABSTRACT

A waveform display device displays first and second waveform data whose value changes with respect to a time axis. Based on a first point on the first waveform data, a second point on the second waveform data which is in a correspondence with the first point is obtained. Correspondence data indicating a correspondence between the first point and the second point is generated. Then, based on the correspondence data, the first and second waveform data is displayed in a manner such that a predetermined point (a reference point) on the first waveform data and a point on the second waveform data which is in a correspondence with the reference point overlap one another on a time axis.

2 Claims, 7 Drawing Sheets

(56) References Cited

U.S. PATENT DOCUMENTS

2013/0222391 A1* 8/2013 Tezuka .................. G06T 11/20
345/440.1

FOREIGN PATENT DOCUMENTS

| JP | 2010-249638 A | 11/2010 |
|---|---|---|
| JP | 4770532 B2 | 9/2011 |
| JP | 2013-11566 A | 1/2013 |

OTHER PUBLICATIONS

Agilent InfiniiVision 4000 X-Series Oscilloscopes User Manual, pp. 1, 2 and 94-96 (Agilent Technologies, Third edition, Sep. 2013). (Year: 2013).*

Office Action in JP Application No. 2016-012473, dated Dec. 19, 2017, 7 pp.

* cited by examiner

```
my $t1=$t1_0;
my $t2=$t2_0;
while ( ($t1 <= $t1e) && ($t2 <= $t2e) ){
    if ( $w1[$t1] == $w2[$t2] ) {
        $t1++;
        $t2++;
    }
    elsif ( ($w1[$t1] <= $w1[$t1-1]) &&
            ($w2[$t2] <= $w2[$t2-1]) ) {
        # DECREASING
        if ( $w1[$t1] > $w2[$t2] ) {
            $t1++;
        }
        else {
            $t2++;
        }
    }
    elsif ( ($w1[$t1] >= $w1[$t1-1]) &&
            ($w2[$t2] >= $w2[$t2-1]) ) {
        #INCREASING
        if ( $w1[$t1] < $w2[$t2] ) {
            $t1++;
        }
        else {
            $t2++;
        }
    }
    else {
        # CANNOT DEAL WITH THIS ALGORITHM
        # PROCESSING FOR PREVENTING INFINITE LOOP
        $t1++;
        $t2++;
    }
    push(@r, [$t1,$t2]);    #[RECORD WAVEFORM]
}
```

WAVEFORM DISPLAY DEVICE THAT ALLOWS CYCLE TIME COMPARISON TO BE MADE

RELATED APPLICATIONS

The present application claims priority to Japanese Patent Application No. 2016-012473 filed Jan. 26, 2016, the disclosure of which is hereby incorporated by reference herein in its entirety.

BACKGROUND OF THE INVENTION

1. Field of the Invention

The present invention relates to waveform display devices and, in particular, relates to a waveform display device that allows a cycle time comparison to be made.

2. Description of the Related Art

A numerical controller performs machining based on information on a machining path and a machining speed designated by a machining program and, in addition to the machining program, settings including previously designated acceleration and deceleration and maximum machining speed. Therefore, even in machining that uses the same machining program, as a result of an operator changing the above-described settings, it is possible to reduce the cycle time required for one machining operation. As a method of determining the effect of reduction of the cycle time based on such a change of settings or the like, there is a method by which a comparison is made between unevenness (hereinafter referred to as a waveform) in coordinate values in a coordinate-time diagram before a change of the above-described settings and unevenness in the coordinate values after the change of the settings.

One machining operation lasts for a few minutes or, in some cases, lasts for several hours. When a comparison is made for the waveform of such a machining operation, it is necessary to conduct the work of locating, from the entire waveform, an area in which a process on which a comparison is desired to be made is performed and offsetting the time axis of the waveform such that the time axes of the waveforms on which a comparison is to be made overlap one another.

In general, even when parts of waveforms of machining performed before and after the settings are changed are overlapped one another with the time axes thereof offset, the other parts of the waveforms do not overlap one another. Therefore, after a comparison about a part of a waveform corresponding to a certain process is made, if a comparison about a part of the waveform corresponding to another process is desired to be made, it is necessary to conduct the work of offsetting the time axis of the waveform again so that the time axes of the waveforms on which a comparison is to be made overlap one another. This work is not completed by being conducted only once and has to be conducted every time an area of a waveform in which a comparison is made is changed.

Figure 10:
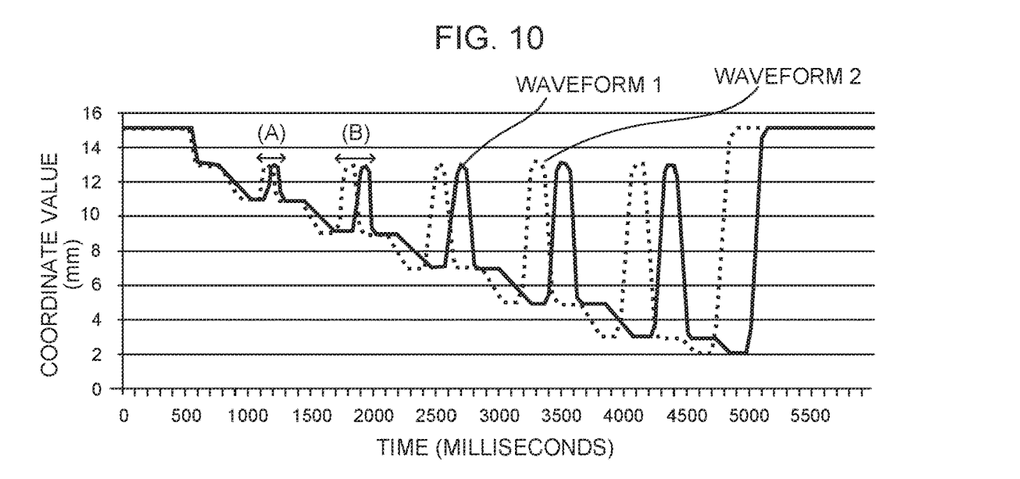
FIG. 10 is a diagram depicting an example in which a plurality of waveforms are displayed on a screen.

For example, a case where, after a comparison about a part (A) is made between a waveform (a waveform 1) indicated by a solid line and a waveform (a waveform 2) indicated by a broken line, which are depicted in FIG. 10, a comparison about a part (B) is made will be considered.

A Comparison about the Part (A) of the Waveform

Procedure 1: In order to make a comparison about the part (A) between the waveform 1 and the waveform 2, the operator enlarges and displays the parts (A) of the waveform 1 and the waveform 2 by operating an input portion of a waveform display device.

Procedure 2: Since the areas near (A) of the waveform 1 and the waveform 2 do not overlap one another in this state, the operator offsets the waveform 2 by operating the input portion of the waveform display device in order to make the areas near (A) of the waveform 1 and the waveform 2 overlap one another.

Figure 11:
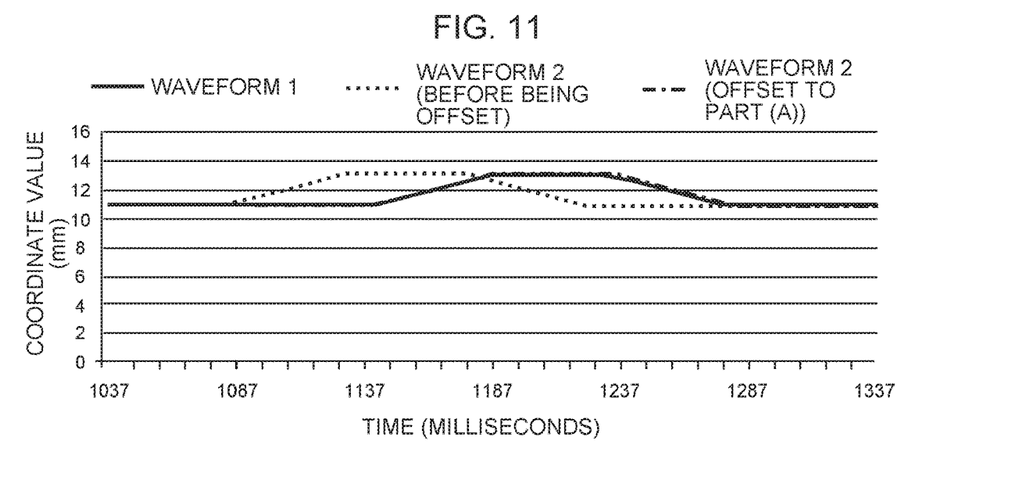
FIG. 11 is a diagram depicting an example in which display is performed by offsetting a waveform 2 such that a waveform 1 and the waveform 2 overlap one another in a part (A) of FIG. 10.

Procedure 3: By offsetting the waveform 2, the areas near (A) of the waveform 1 and the waveform 2 overlap one another (FIG. 11) and the operator can make a waveform comparison.

A Comparison about the Part (B) of the Waveform

Procedure 4: Next, in order to make a comparison about the part (B) of the waveform, the operator scrolls the waveform to the part (B) by operating the input portion of the waveform display device.

Figure 12:
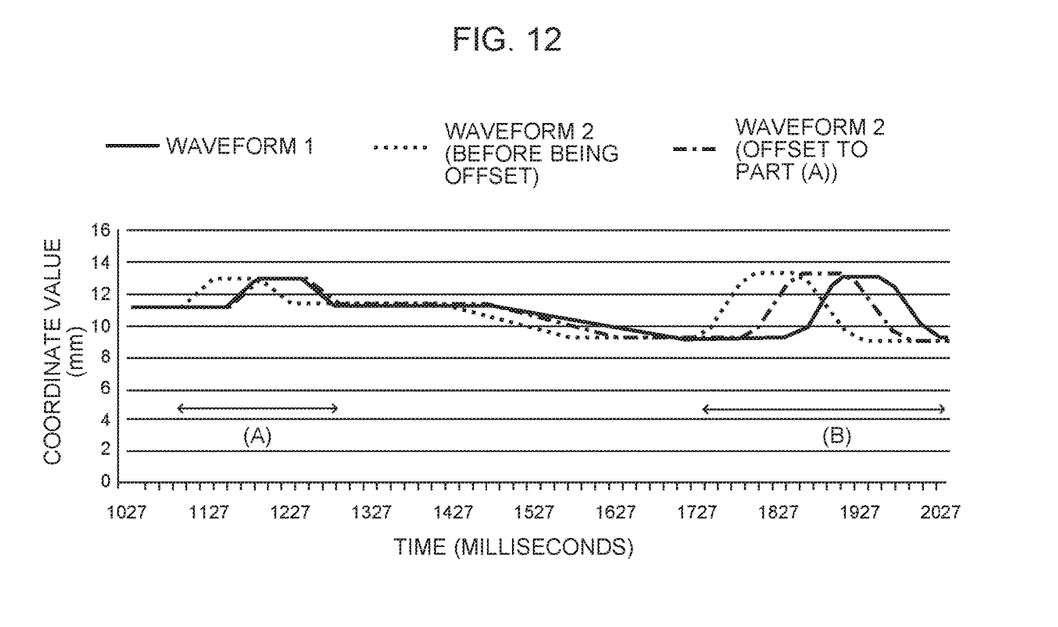
FIG. 12 is a diagram depicting an example in which the parts (A) and (B) in FIG. 10 are displayed.

Procedure 5: In a state in which the areas near (A) of the waveform 1 and the waveform 2 overlap one another, areas near (B) of the waveform 1 and the waveform 2 do not overlap one another because of a difference in cycle time from the part (A) to the part (B) (FIG. 12). Thus, the operator offsets the waveform 2 again by operating the input portion of the waveform display device.

Figure 13:
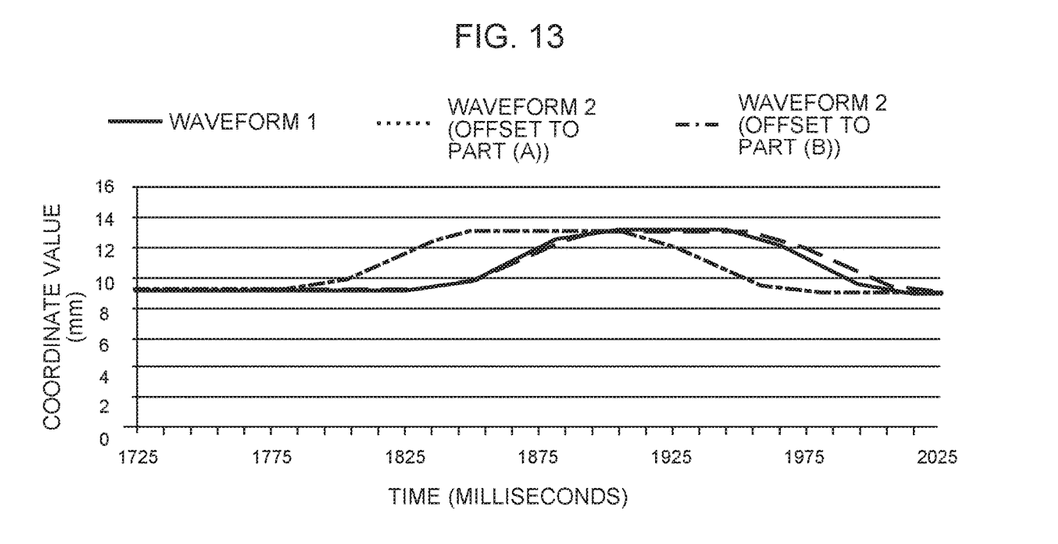
FIG. 13 is a diagram depicting an example in which display is performed by offsetting the waveform 2 such that the waveform 1 and the waveform 2 overlap one another in the part (B) of FIG. 10.

Procedure 6: Then the areas near (B) of the waveform 1 and the waveform 2 overlap one another (FIG. 13) and the operator can make a waveform comparison.

As described above, every time a location in which a waveform comparison is made is changed, it is necessary to conduct the work of offsetting the waveform 2 to make the waveform 2 overlap the waveform 1. In order to save the time and trouble of conducting this work, the technique of making it possible to move a waveform by drag and drop by using, for example, a mouse, a touch panel, or the like is used. Moreover, in Japanese Patent Application Laid-Open No. 2007-248437, the technique of setting a plurality of reference positions on a plurality of waveforms and displaying the reference positions selected by the user such that the reference positions overlap one another is disclosed. Furthermore, in Japanese Patent Application Laid-Open No. 2010-249638, the technique of displaying a plurality of pieces of waveform data such that the plurality of pieces of waveform data overlap one another and displaying each time axis corresponding to each piece of waveform data is disclosed.

However, even when it makes it possible to move a waveform by drag and drop by using a mouse, a touch panel, or the like, the operation of making the waveforms overlap one another in each case is still troublesome and time-consuming for the user. Moreover, even when the above-described technique disclosed in Japanese Patent Application Laid-Open No. 2007-248437 is used, it is necessary to perform the operation to set the reference positions and select the reference positions for each part on which a comparison is to be made, which makes it complicated for the user. Furthermore, even when the above-described technique disclosed in Japanese Patent Application Laid-Open No. 2010-249638 is used, the user has to enter the data range of each waveform on which a comparison is to be made, and the fact remains that, if the number of parts on which a comparison is to be made increases, it takes a lot of trouble to perform the operation.

In addition, if a cycle time comparison is desired to be made, it is necessary to read a cycle time of each block from a graph, which causes another problem to arise: it takes a lot of trouble to make a comparison to determine in which part of machining a difference in cycle time is found.

SUMMARY OF THE INVENTION

An object of the present invention is accordingly to provide a waveform display device that can save the user effort when the user makes a comparison about a plurality of parts between a plurality of waveforms.

A waveform display device according to the present invention has the function of displaying first waveform data and second waveform data, each being data whose value changes with respect to a time axis, in such a way that a comparison therebetween can be made, and includes: a correspondence data generating unit that obtains, based on a first point on the first waveform data, a second point on the second waveform data which is in a correspondence with the first point and generates correspondence data indicating a correspondence between the first point and the second point; and a display unit that displays, based on the correspondence data generated by the correspondence data generating unit, the first waveform data and the second waveform data in a manner such that a predetermined point on the first waveform data, which serves as a reference point, and a point on the second waveform data which is in a correspondence with the reference point overlap one another on the time axis.

The waveform display device may further include a cycle time increase/decrease calculating unit that calculates, based on the correspondence data generated by the correspondence data generating unit, an increase/decrease value of a cycle time at each of points which are in a correspondence with each other between the first waveform data and the second waveform data, wherein the display unit may perform display about the increase/decrease value of the cycle time calculated by the cycle time increase/decrease calculating unit in association with the first waveform data and the second waveform data.

The reference point may be designated based on an operation performed by a user.

The present invention makes it possible to make waveforms in areas displayed on a screen overlap one another automatically, which facilitates checking a difference in waveforms for each process. Moreover, it is possible to check visually an area in which there is a difference in cycle time during machining. Furthermore, it becomes possible to locate an area which is a cause of a difference in cycle time with ease, which makes it possible to reduce the time of examination for reducing the cycle time.

DETAILED DESCRIPTION OF THE PREFERRED EMBODIMENTS

Hereinafter, an embodiment of the present invention will be described with reference to the drawings. First, the basic principles of the present invention will be explained.

In a waveform display device of the present invention, a correspondence between points on a plurality of waveforms on which a comparison is to be made is obtained. Next, based on the correspondence thus obtained, a plurality of waveforms are displayed such that the waveforms overlap one another in accordance with the position of a waveform that is displayed by the user. Moreover, a graph of a difference between cycle times is displayed.

<How to Obtain a Correspondence Between Respective Points on a Plurality of Waveforms>

Figure 1:
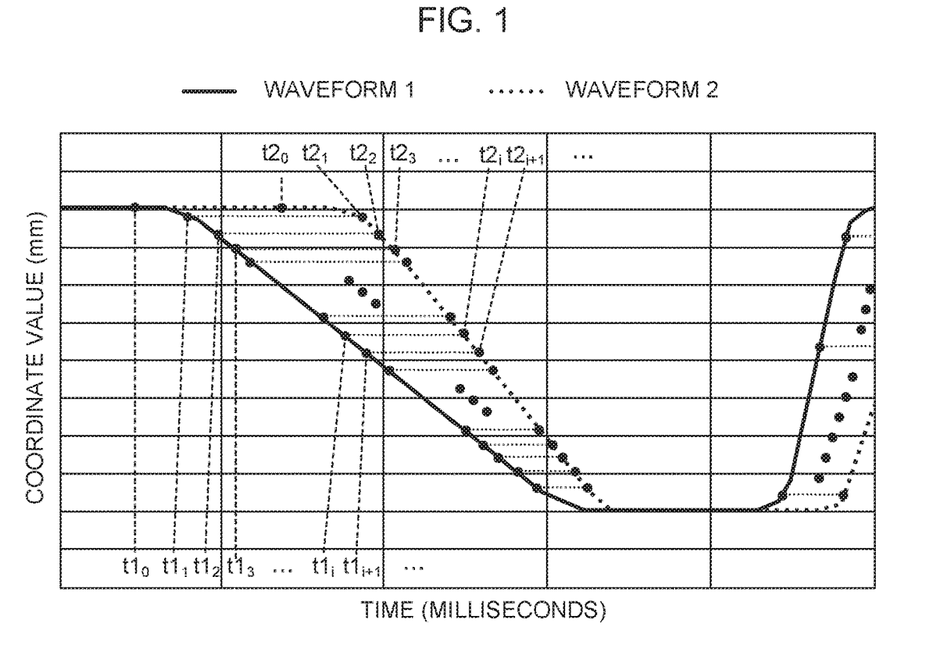
FIG. 1 is a diagram explaining a correspondence between a plurality of waveforms in the present invention.

FIG. 1 is a diagram explaining a correspondence between a plurality of waveforms.

For example, when a correspondence between two waveforms (a waveform 1 and a waveform 2) is obtained, a set of times t1 and t2 which satisfies that $W1(t1)$ is equal to $W2(t2)$ in a case where the waveform 1 and the waveform 2 are expressed as time functions $W1(t)$ and $W2(t)$ is obtained. As more specific procedures, the following procedures 1 to 3 are performed.

Procedure 1: First, $t1_0$ and $t2_0$ which satisfy that $W1(t1_0)$ is approximately equal to $W2(t2_0)$ are given from the outside.

Procedure 2: Next, from $t1_i$ and $t2_i$, $t1_{i+1}$ ($\geq t1_i$) and $t2_{i+1}$ ($\geq t2_i$) which satisfy that $W1(t1_{i+1})$ is approximately equal to $W2(t2_{i+1})$ are obtained.

Procedure 3: The above procedure 2 is repeated to the termination of the waveform, whereby some sets of $t1_i$ and $t2_i$ are obtained.

Incidentally, when a correspondence among points on three or more waveforms is obtained, a correspondence simply has to be obtained as follows: any one of the waveforms is used as a reference and a correspondence between a point on that waveform and a point on each of the other waveforms is obtained.

Note that "approximately equal to" in the above expression "W1($t1_i$) approximately equal to W2($t2_i$)" is adopted with consideration given to a situation in which points which become perfectly equal to each other between two waveforms cannot be found due to an error that is caused in a machining apparatus, a sensor, or the like, and "approximately equal to" is used in the sense of "substantially equal to each other, while allowing for a margin of error".

In the above-described procedures, a correspondence is obtained with t1 and t2 being moved in a + (plus) direction on the time axis, but a correspondence can also be obtained in a similar manner by obtaining the correspondence with t1 and t2 being moved in a − (minus) direction on the time axis.

Incidentally, although each of initial values $t1_0$ and $t2_0$ may be set at the head of the corresponding waveform; however, initial values $t1_0$ and $t2_0$ given by the user make it possible to respond to a wider variety of circumstances. Moreover, settings may be made such that a plurality of sets of initial values $t1_0$ and $t2_0$ can be set. By so doing, for an area for which a correspondence cannot be obtained properly by the present method, it becomes possible for the user to make modification arbitrarily.

Furthermore, the above description deals with a single-axis coordinate value; however, as long as data is data that can be obtained by time unit, a correspondence of any data can be obtained. For example, the data may be the following data.

A set of some coordinate values (for example, coordinate values on the X, Y, and Z axes)

A program number, a sequence number

A combination of those described above

Figure 2:
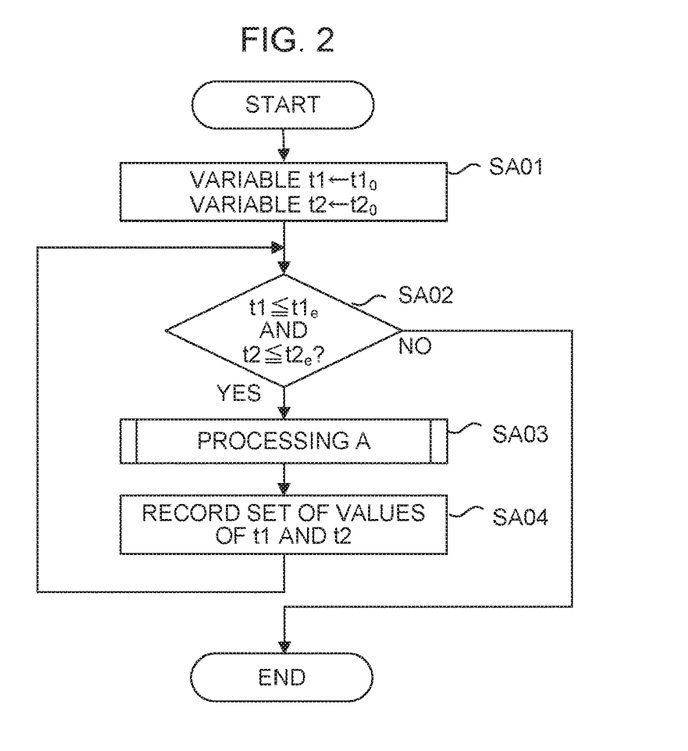
FIG. 2 is a flowchart of an example of a processing in which each point on one of two waveforms is related to a point on the other of the two waveforms.

FIG. 2 is a flowchart of an example of processing in which respective points on a waveform 1 and a waveform 2 are associated with each other when the waveform 1 is assumed to be W1($t$) and the waveform 2 is assumed to be W2($t$). Moreover, FIG. 3 is a flowchart of an example of processing corresponding to Processing A in FIG. 2.

Figure 3:
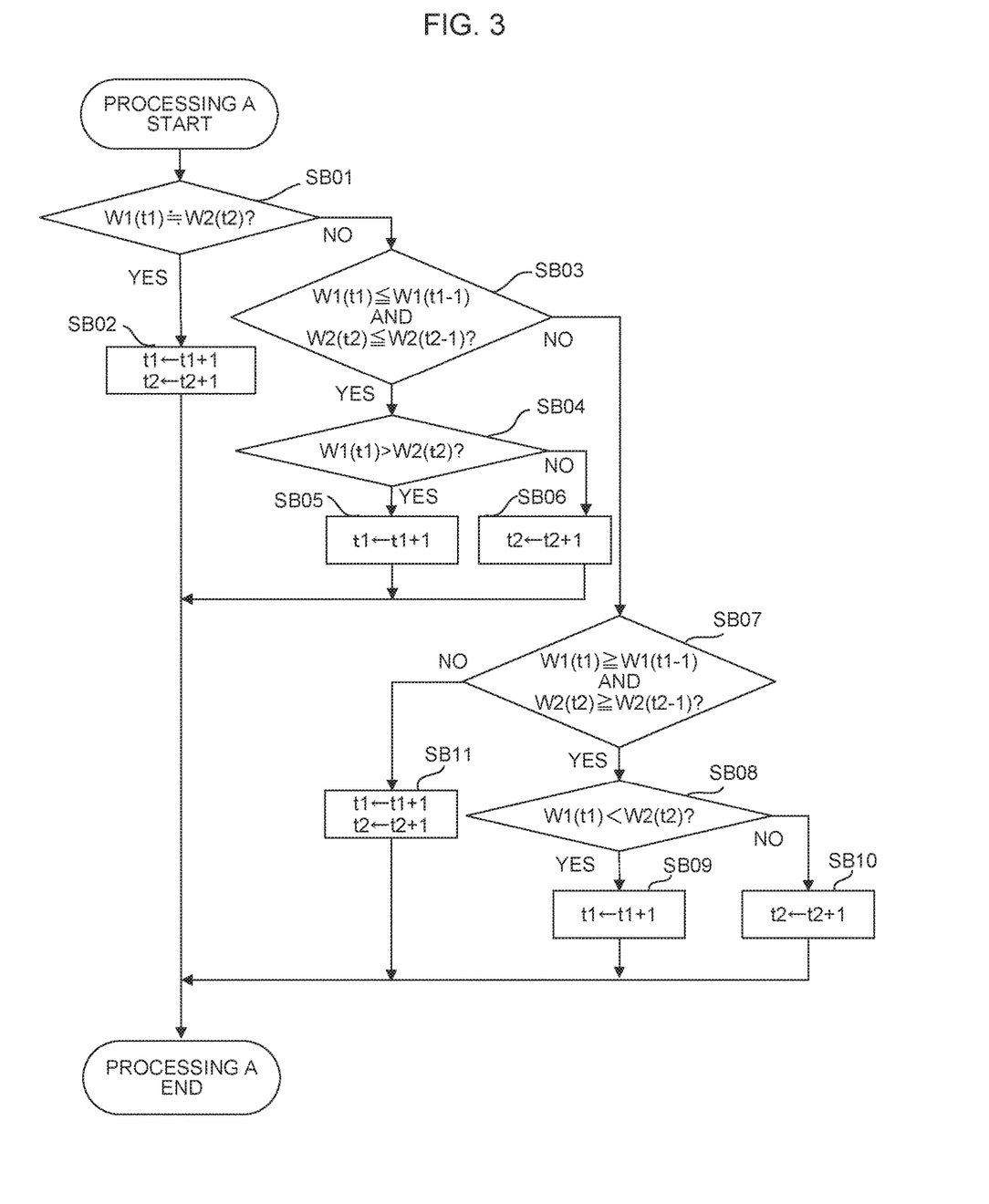
FIG. 3 is a flowchart of an example of processing corresponding to Processing A in FIG. 2.

In FIGS. 2 and 3, $t1_0$ and $t2_0$ are values which are given in advance by the user and satisfy that W1($t1_0$) is equal to W2($t2_0$) and are the times of starting points of associating processing of the waveform 1 and the waveform 2. Moreover, $t1_e$ is the time of an end point of the associating processing of the waveform 1, and $t2_e$ is the time of an end point of the associating processing of the waveform 2.

Hereinafter, each step of the flowchart indicating the flow of the associating processing depicted in FIG. 2 will be described.

[Step SA01] The time $t1_0$, which is given by the user, of the starting point of the associating processing of the waveform 1 is substituted for a variable t1 (hereinafter, t1), and the time $t2_0$, which is given by the user, of the starting point of the associating processing of the waveform 2 is substituted for a variable t2 (hereinafter, t2).

[Step SA02] A judgment is made as to whether or not the value of t1 is smaller than or equal to $t1_e$ which is the time of an end point of the associating processing of the waveform 1 and the value of t2 is smaller than or equal to $t2_e$ which is the time of an end point of the associating processing of the waveform 2. If the above condition is met, the processing proceeds to Step SA03; if the above condition is not met, the associating processing is ended.

[Step SA03] Processing A, which will be described later, is executed.

[Step SA04] A set of the values of t1 and t2 is recorded as a set of the times indicating a correspondence between the waveform 1 and the waveform 2, and the processing goes back to Step SA02.

Hereinafter, each step of the flowchart indicating the flow of Processing A depicted in FIG. 3 will be described.

[Step SB01] A judgment is made as to whether or not a coordinate value W1($t1$) of the waveform 1 at the time t1 and a coordinate value W2($t2$) of the waveform 2 at the time t2 are substantially equal to each other, while allowing for a margin of error. If the coordinate value W1($t1$) and the coordinate value W2($t2$) are substantially equal to each other, while allowing for a margin of error, the processing proceeds to Step SB02; otherwise, the processing proceeds to Step SB03.

[Step SB02] Each of the values of t1 and t2 is incremented by 1 (unit: millisecond), and Processing A is ended.

[Step SB03] A judgment is made as to whether or not the coordinate value W1($t1$) of the waveform 1 at the time t1 is smaller than or equal to a coordinate value W1($t1$-1) of the waveform 1 at a time t1-1 (that is, the waveform 1 remains the same or decreases before and after the time t1) and the coordinate value W2($t2$) of the waveform 2 at the time t2 is smaller than or equal to a coordinate value W2($t2$-1) of the waveform 2 at a time t2-1 (that is, the waveform 2 remains the same or decreases before and after the time t2). If the above condition is met, the processing proceeds to Step SB04; if the above condition is not met, the processing proceeds to Step SB07.

[Step SB04] A judgment is made as to whether or not the coordinate value W1($t1$) of the waveform 1 at the time t1 is greater than the coordinate value W2($t2$) of the waveform 2 at the time t2. If the coordinate value W1($t1$) is greater than the coordinate value W2($t2$), the processing proceeds to Step SB05; otherwise, the processing proceeds to Step SB06.

[Step SB05] The value of t1 is incremented by 1 (unit: millisecond), and Processing A is ended.

[Step SB06] The value of t2 is incremented by 1 (unit: millisecond), and Processing A is ended.

[Step SB07] A judgment is made as to whether or not the coordinate value W1($t1$) of the waveform 1 at the time t1 is greater than or equal to the coordinate value W1($t1$-1) of the waveform 1 at the time t1-1 (that is, the waveform 1 remains the same or increases before and after the time t1) and the coordinate value W2($t2$) of the waveform 2 at the time t2 is greater than or equal to the coordinate value W2($t2$-1) of the waveform 2 at the time t2-1 (that is, the waveform 2 remains the same or increases before and after the time t2). If the above condition is met, the processing proceeds to Step SB08; if the above condition is not met, the processing proceeds to Step SB11.

[Step SB08] A judgment is made as to whether or not the coordinate value W1($t1$) of the waveform 1 at the time t1 is smaller than the coordinate value W2($t2$) of the waveform 2 at the time t2. If the coordinate value W1($t1$) is smaller than the coordinate value W2($t2$), the processing proceeds to Step SB09; otherwise, the processing proceeds to Step SB10.

[Step SB09] The value of t1 is incremented by 1 (unit; millisecond), and Processing A is ended.

[Step SB10] The value of t2 is incremented by 1 (unit; millisecond), and the processing A is ended.

[Step SB11] The value of each of t1 and t2 is incremented by 1 (unit; millisecond), and Processing A is ended (the processing in this step is exceptional processing).

Figure 4:
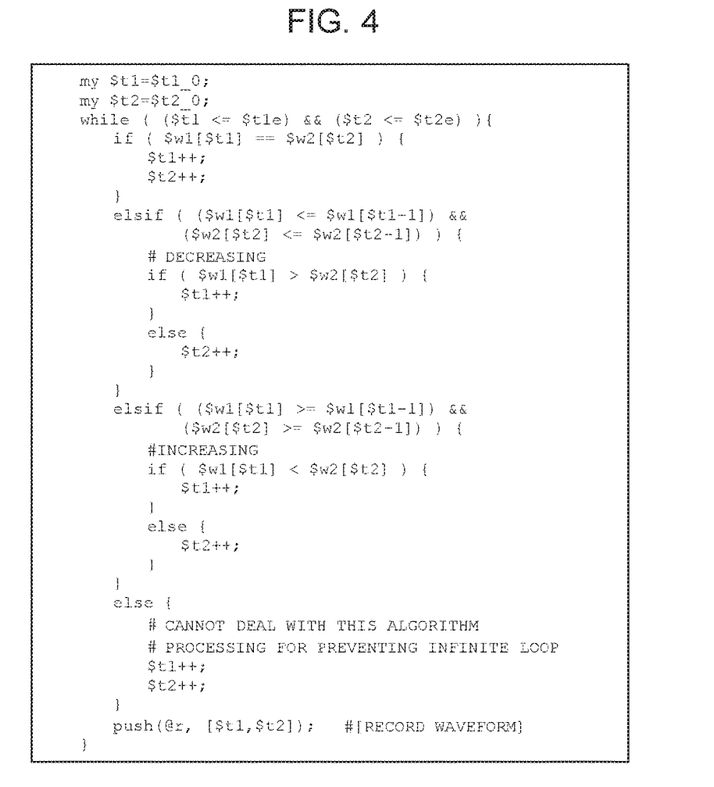
FIG. 4 is an example of a program obtained by implementing the algorithm of the flowchart of FIG. 3 by using Perl.

FIG. 4 depicts an example of a program obtained by implementing the algorithm of the above-described flowchart by using Perl.

By the above processing, a correspondence $t1_i$, $t2_i$ between each point on the waveform 1 and each point on the waveform 2 is obtained.

Moreover, as for i that satisfies an expression $t1_i \le t \le t1_{i+1}$ for each point W1(t) of the waveform 1, since the time of the waveform 2 corresponding to $t1_i$ is $t2_i$, a differential $W1_{\mathit{diff}}(t)$ between corresponding points of the waveform 1 and the waveform 2 can be calculated by using the following expression (1) for each point of the waveform 1.

$$W1_{\mathit{diff}}(t)=t1_i-t2_i \quad (1)$$

where i satisfies $t1_i \le t \le t1_{i+1}$

Then, from the above expression (1), an increase in cycle time for the waveform 2 between $t1_a$ and $t1_b$ of the waveform 1 can be calculated by the following expression (2).

$$\text{Increase in cycle time} = W1_{\mathit{diff}}(t1_b) - W1_{\mathit{diff}}(t1_a) \quad (2)$$

<Method of Displaying Waveforms in a Manner Such that the Waveforms Overlap One Another>

Based on the correspondence between a plurality of waveforms obtained by the above-described method, a graph in which these waveforms overlap one another is displayed. Hereinafter, an example in which a graph where a process of one of the two waveforms, the waveform 1 and the waveform 2, and the same process of the other of the two waveforms overlap one another is displayed will be described.

If "a reference position of the waveform 1" is assumed to be T1, "a reference position of the waveform 2" corresponding to T1 is obtained, as T2, by the following expression (3).

$$T2=T1-W1_{\mathit{diff}}(T1) \quad (3)$$

Then, a graph of the waveform 1 and the waveform 2 is displayed in a manner such that the time T1 which is the reference position of the waveform 1 and the time T2 which is the reference position of the waveform 2 overlap one another. More specifically, the waveform 2 is offset forward by $\Delta=T1-T2$ with respect to the waveform 1, in other word, a graph of $W2(t-\Delta)$ with respect to $W1(t)$ is displayed.

Figure 5:
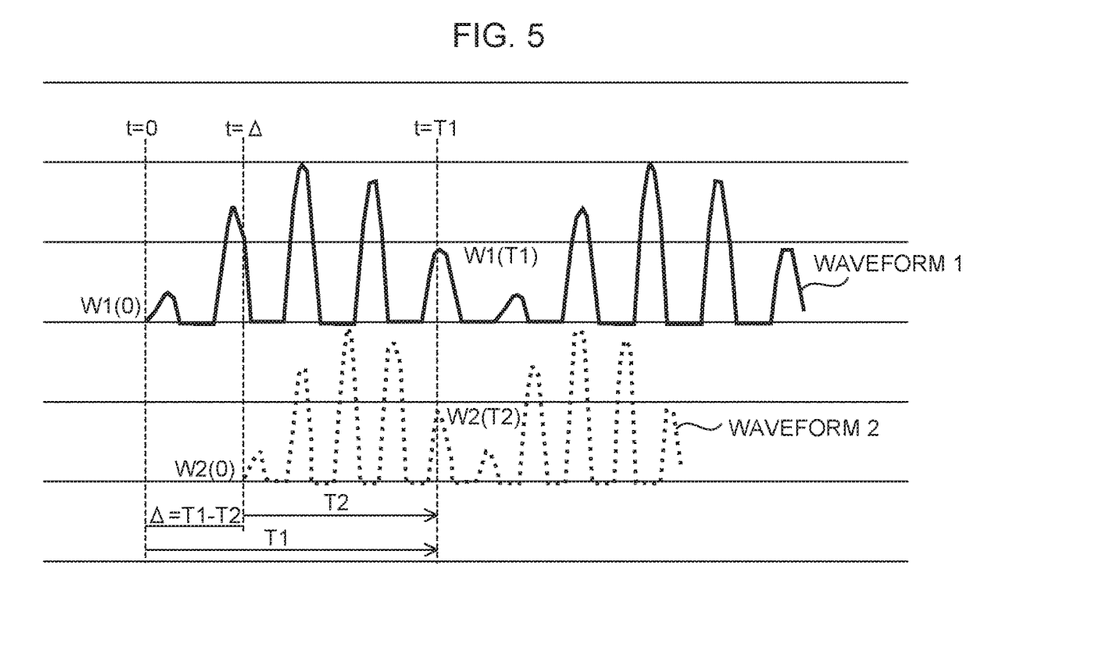
FIG. 5 illustrates an example in which a graph of a waveform 1 and a graph of a waveform 2 are displayed in a manner such that a time T1 which is a reference position of the waveform 1 and a time T2 which is a reference position of the waveform 2 overlap one another.

FIG. 5 illustrates an example in which a graph of the waveform 1 and the waveform 2 is displayed in a manner such that the time T1 which is the reference position of the waveform 1 and the time T2 which is the reference position of the waveform 2 overlap one another.

Figure 6:
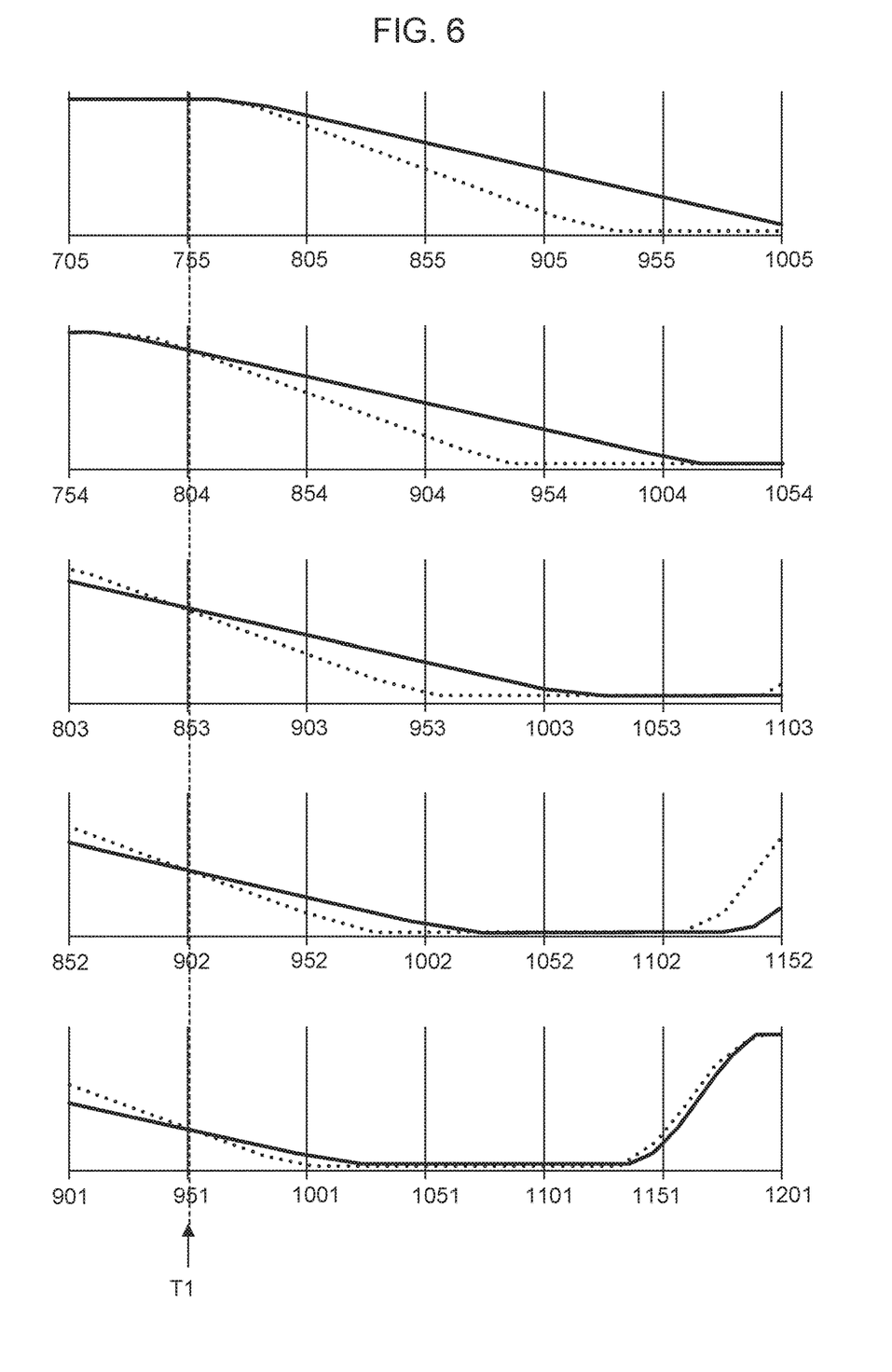
FIG. 6 illustrates an example in which a waveform is displayed, following time axis scrolling conducted by the user, with a time in a specific position on a screen being set as T1.

As for a method of selecting T1 which is "the reference position of the waveform 1", for example, a method by which the user is made to make a selection is possible. Moreover, as another method, as depicted in FIG. 6, a method may be adopted by which the time in a specific position on a screen is assumed to be T1 and T1 may be caused to move in association with user's movement (scrolling) of a time axis. If such a method is adopted, since the waveforms of the same process are always displayed on a display screen in a manner such that the waveforms overlap one another, a configuration that is more suitable for waveform/cycle time comparisons is achieved.

Furthermore, if the time T1 which is "the reference position of the waveform 1" is indicated on the screen, the user can always grasp the position which is currently used as a reference, which makes this configuration appropriate. In addition, making it possible to move T1 by a mouse or the like makes the configuration more appropriate.

Incidentally, when display based on the correspondence among points on three or more waveforms is performed, the display of each waveform has to be simply performed based on a correspondence between each waveform and the waveform used as a reference.

<Graphical Representation of Cycle Time>

By indicating $W1_{\mathit{diff}}(t)$ along with the graph W1(t) of the waveform 1, it is possible to implement display by which an area in which the cycle time increases or decreases can be grasped visually and quantitatively. For example, in a graph depicted in FIG. 7, by reading "an increase ($W1_{\mathit{diff}}(t)$) in the cycle time" at each of points A to E from the graph, a difference in cycle time in each of the following areas (AB, BC, CD, AE) is calculated.

Figure 7:
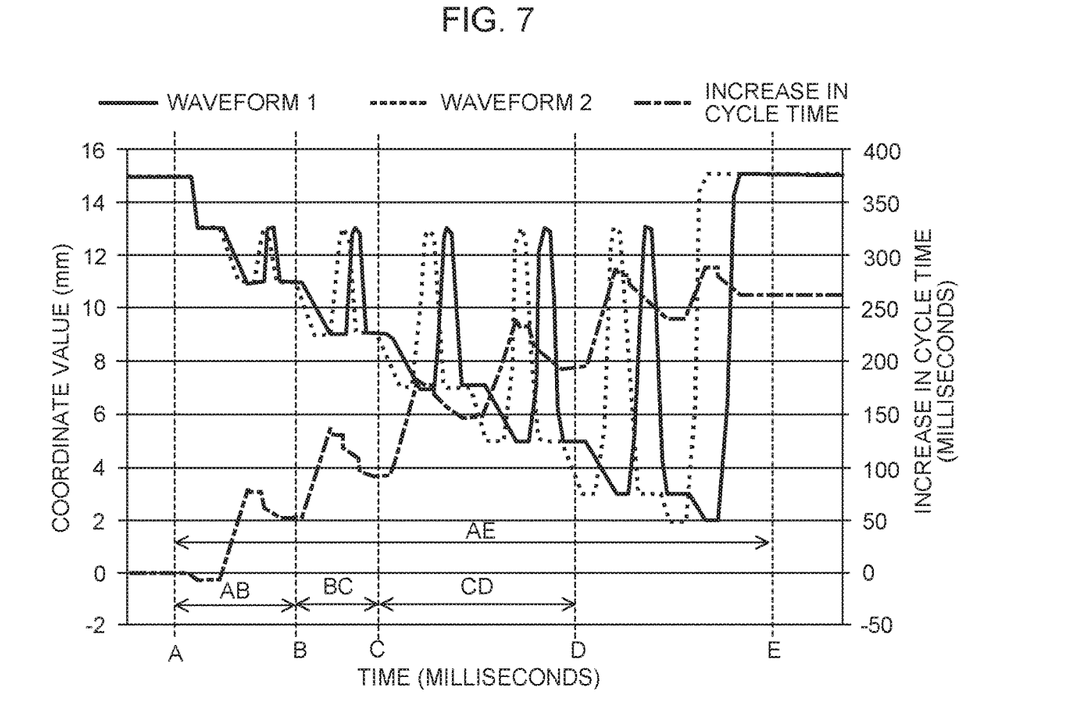
FIG. 7 is a diagram depicting an example in which an increase in cycle time is displayed together with waveform data.

A difference in cycle time in the area AB is about 50 milliseconds (the point B (about 50 ms)–the point A (about 0 ms)).

A difference in cycle time in the area BC is about 40 milliseconds (the point C (about 90 ms)–the point B (about 50 ms)).

A difference in cycle time in the area CD is about 100 milliseconds (the point D (about 190 ms)–the point C (about 90 ms)).

A difference in cycle time in the entire area (the area AE) is about 260 milliseconds (the point E (about 260 ms)–the point A (about 0 ms)).

As described above, it is possible to grasp quantitatively a difference in cycle time in any area.

Figure 8:
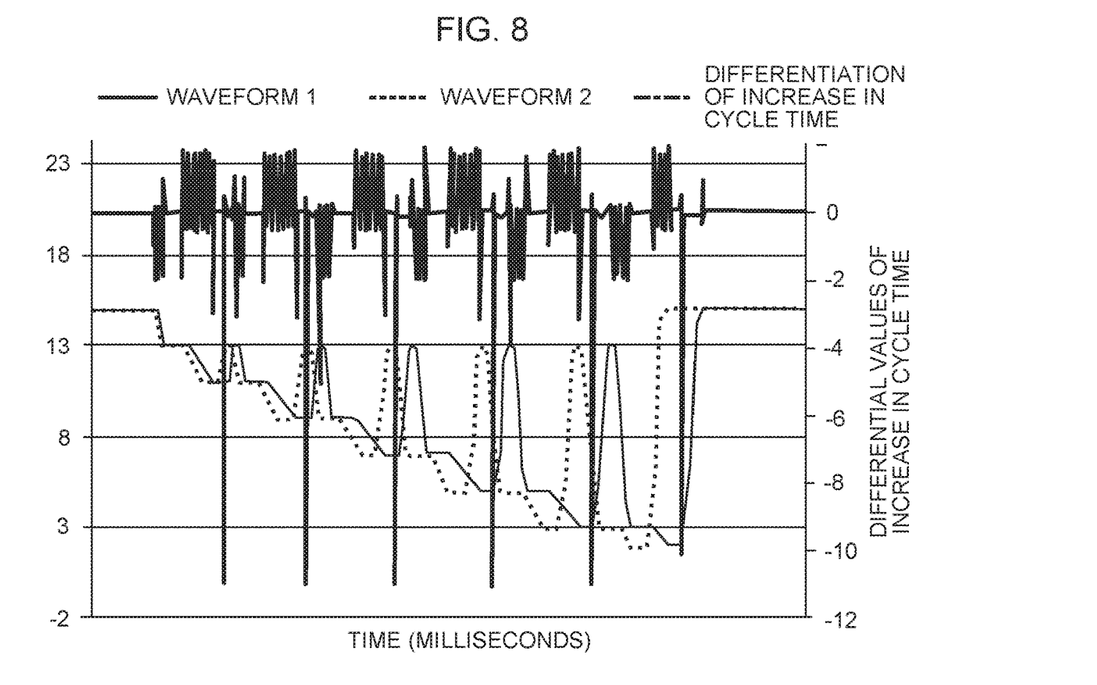
FIG. 8 is a diagram depicting an example in which the differential value of an increase in cycle time is displayed together with waveform data.

Moreover, since $W1_{\mathit{diff}}(t)$ often monotonously increases or decreases, a long vertical axis is required to display the details of a graph. If a space therefor cannot be provided, values obtained by differentiating $W1_{\mathit{diff}}(t)$ may be displayed as depicted in FIG. 8, which makes it possible to achieve display by which an area in which the cycle time increases or decreases can be grasped while saving space more effectively.

Figure 9:
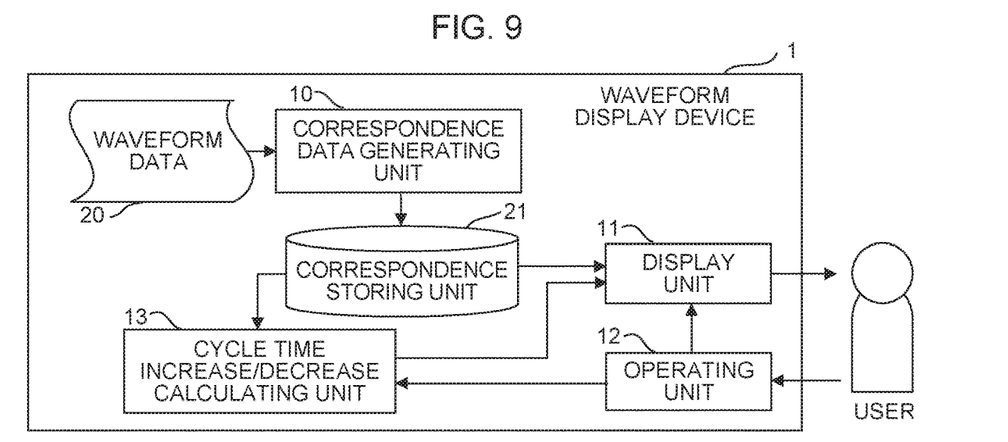
FIG. 9 is a functional block diagram of a waveform display device according to an embodiment of the present invention.

FIG. 9 is a functional block diagram of a waveform display device according to an embodiment of the present invention which implements the above-described functions.

A waveform display device 1 includes, as functional units, a correspondence data generating unit 10, a display unit 11, an operating unit 12, and a cycle time increase/decrease calculating unit 13.

The correspondence data generating unit 10 obtains a correspondence between respective points on a plurality of waveforms by performing processing based on the above-described method of obtaining a correspondence on the basis of a plurality of pieces of waveform data 20, generates correspondence data indicating the obtained correspondence, and stores the correspondence data in a correspondence storing unit 21 provided on an unillustrated memory.

The display unit 11 generates data for display of waveforms on the basis of the correspondence between the plurality of waveforms stored in the correspondence storing unit 21 and displays the data on an unillustrated display such as a liquid crystal display device. Moreover, the operating unit 12 accepts an input of T1 which is "the reference position of the waveform 1" described above, a screen scroll command, and so forth by receiving an input from an unillustrated input device such as a keyboard or a mouse, and issues a command to the display unit 11 to change the display based on these inputs. The display unit 11 performs the above-described changes of display based on the command from the operating unit 12.

When the cycle time increase/decrease calculating unit 13 receives, for example, a display command to display an increase in cycle time given by the user, the cycle time increase/decrease calculating unit 13 calculates an increase/decrease value of the cycle time in an area in which there is each correspondence between the points on the waveforms based on the correspondence between the plurality of waveforms stored in the correspondence storing unit 21 and outputs the calculated increase/decrease value of the cycle time to the display unit 11. Based on the increase/decrease value of the cycle time obtained from the cycle time increase/decrease calculating unit 13, the display unit 11 adds an increase in cycle time or a differential value of the increase to the data for display and displays the result on the display.

The waveform display device 1 can be incorporated into devices in general that may be generally used to compare and display waveforms, such as a controller that controls a machining tool, a simulation device, and a personal computer.

While the embodiment of the present invention has been described above, the present invention is not limited to the example of the above-described embodiment and can be carried out in various modes by being appropriately changed and modified.

The invention claimed is:

1. A waveform display device for a numerical controller for controlling machining of an object based on information from a machining program and settings, the waveform display device is configured to display first waveform data and second waveform data for comparison therebetween, the waveform display device comprising:
   an operating unit configured to receive
      first settings corresponding to a machining acceleration or speed of the machining of the object, the first waveform data corresponding to a first amount of time required to perform a machining operation on the object at the first settings, and
      second settings corresponding to a different machining acceleration or speed of the machining of the object, the second waveform data corresponding to a second amount of time required to perform the same machining operation on the object at the second settings, wherein the second settings replace the first settings and the second amount of time is different from the first amount of time;
   a correspondence data generating unit configured to
      obtain, based on a first point on the first waveform data, a second point on the second waveform data which is in a correspondence with the first point, wherein coordinate values of the first waveform data and the second waveform data change with respect to a time axis, and
      generate correspondence data indicating a correspondence between the first point and the second point, wherein
      the first waveform data represent machining the object based on information from the machining program and the first settings input to the operating unit, and the second waveform data represent machining the object based on information from the machining program and the second settings input to the operating unit, and the second settings replace the first settings;
   a display unit configured to display, based on the correspondence data generated by the correspondence data generating unit, the first waveform data and the second waveform data in a manner such that
      (1) a predetermined point on the first waveform data, which serves as a reference point, and
      (2) a point on the second waveform data, which is in a correspondence with the reference point, overlap one another on the time axis; and
   a cycle time increase/decrease calculating unit configured to calculate, based on the correspondence data generated by the correspondence data generating unit, an increase/decrease value between
      (1) a cycle time which is a time required for machining the object up to a point on the second waveform data which is in correspondence with each point on the first waveform data, and
      (2) a cycle time which is a time required for machining the object up to said each point on the first waveform data, wherein
   the display unit is further configured to display the increase/decrease value of the cycle time calculated by the cycle time increase/decrease calculating unit in association with the first waveform data and the second waveform data, and
   the numerical controller is configured to control machining of the object based on information from the machining program and the settings after changing the settings, with which an effect of reduction of the cycle time is determined,
   wherein, when the reference point on the first waveform specified by the first waveform data is T1, the point on the second waveform specified by the second waveform data and corresponding to T1 is obtained as T2 by the following expression:

$T2=T1-W1_{diff}(T1),$ where $W1_{diff}$ is a difference between corresponding points of the first waveform data and the second waveform data,
   on the display unit, the second waveform is offset forward by $\Delta=T1-T2$ with respect to the first waveform data so that T1 and T2 overlap one another on the time axis, and
   the settings are operator-input sets of initial values.

2. The waveform display device according to claim 1, wherein the reference point is designated based on an operation performed by a user.

* * * * *